United States Patent [19]

Malchow

[11] 4,330,866
[45] May 18, 1982

[54] ARRANGEMENT FOR SELECTIVELY ROUTING A SIGNAL INDICATIVE OF RECEIVED SIGNAL STRENGTH TO DIFFERENT PORTIONS OF A RADIO RECEIVER IN RESPONSE TO DIFFERENT LEVELS OF A CONTROL SIGNAL

[75] Inventor: Max E. Malchow, Flemington, N.J.

[73] Assignee: RCA Corporation, New York, N.Y.

[21] Appl. No.: 143,503

[22] Filed: Apr. 24, 1980

[51] Int. Cl.³ .............................................. H03J 7/18
[52] U.S. Cl. ................................... 455/161; 455/194; 455/200
[58] Field of Search ................ 455/161, 162, 164–166, 455/169, 194, 200, 218–224; 358/193.1

[56] References Cited

U.S. PATENT DOCUMENTS

| | | | |
|---|---|---|---|
| 3,584,307 | 6/1971 | Hewie | 455/194 |
| 3,825,838 | 7/1974 | Mayle | 455/194 |
| 4,123,715 | 10/1978 | Fathauer | 455/194 |
| 4,140,960 | 2/1979 | Ohsawa | 455/194 |
| 4,245,348 | 1/1981 | Imazeki | 455/165 |

OTHER PUBLICATIONS

RCA data sheet for CA3189E, File Number 1046, dated 9–78.

Primary Examiner—Jin F. Ng
Attorney, Agent, or Firm—P. M. Emanuel; A. L. Limberg; E. M. Whitacre

[57] ABSTRACT

An integrated circuit for processing the IF signal of a radio receiver to produce an audio signal also includes a muting circuit for muting the audio signal, detector circuits for generating a stop signal which, e.g., may be used to stop the operation of a scanning tuner when the IF signal has a predetermined condition, an inhibiting circuit for inhibiting the generation of the stop signal and a signal strength for generating positive-going and negative-going signals representing the amplitudes of an RF input signal. The integrated circuit also includes a comparator circuit having first and second input terminals to which the signal strength and stop pulse signals may be applied in a variety of configurations to determine when the RF signal has respective predetermined amplitude conditions and a signal routing circuit for selectively applying the output signal of the comparator circuit to the muting and stop pulse inhibiting circuits in different combinations to accommodate different operating environments of the receiver in response to the level of a routing control signal applied to a control terminal.

15 Claims, 8 Drawing Figures

ARRANGEMENT FOR SELECTIVELY ROUTING A SIGNAL INDICATIVE OF RECEIVED SIGNAL STRENGTH TO DIFFERENT PORTIONS OF A RADIO RECEIVER IN RESPONSE TO DIFFERENT LEVELS OF A CONTROL SIGNAL

ENVIRONMENT OF THE INVENTION

The present invention relates to the field of arrangements for controlling various functions of a radio receiver in accordance with radio-frequency (RF) input signal strength.

Radio receivers employ control signals which represent the amplitude or strength of RF input signals for a variety of purposes. Such control signals typically are employed to control the gain of radio-frequency (RF) and intermediate-frequency (IF) stages. In addition, control signals which represent signal strength are often employed in a signal seeking arrangement to determine when a station with acceptable signal strength has been tuned. Control signals which represent signal strength are also employed in an audio signal muting arrangement to mute the audio signal when the RF input signal strength is unacceptable.

The most desirable combination of signal seeking and muting operation depends on the environment in which the receiver is to be operated; that is, for example, whether there are many strong stations or only a few. Thus, depending on the environment in which the receiver is to be operated, it may be desirable to provide both signal seeking and muting, only signal seeking, only muting, or in some cases, neither signal seeking nor muting. In addition, depending on the environment in which the receiver is to be operated, it may be desirable to establish different signal strength criteria at which the signal seeking and muting arrangements are activated.

A substantial portion of a typical modern radio receiver comprises a single integrated circuit for processing an IF signal derived by a tuner from an RF signal to produce an audio-frequency (AF) signal. These integrated circuits often also include signal seeking and muting circuits. Prior integrated circuits of this type have been designed to provide a fixed combination of signal seeking and muting operation. Thus, integrated circuit manufacturers have been faced with the problem of having to provide different types of integrated circuits for use in different types of radio receivers. In addition, a single integrated circuit which is capable of providing different seeking and muting combinations for radio receivers intended for different environments has been unavailable to receiver manufacturers. The ability to change the combination of signal seeking and muting operations and the signal strength criteria at which the signal strength and muting is particularly desirable when the receiver is likely to be operated in a variety of environments, such as when the receiver is employed in an automobile.

SUMMARY OF THE PRESENT INVENTION

The present invention concerns an arrangement for use in a radio receiver which is suitable for incorporation in an integrated circuit, for selectively routing an enabling signal, generated by a comparator when a predetermined input signal condition exists, to both of, a first one of, a second one of, or neither of signal seeking and muting arrangements in response to the level of a control signal. The level of the control signal may be adjusted to select different combinations of signal seeking and muting operations to accommodate different operating environments of the receiver. Desirably, the comparator has two input terminals and is arranged so that it may be disabled from responding to a first signal, such as a signal representing the input signal strength, applied to a first input terminal in response to the second input signal, such as a pulse signal indicating the tuning of a station, to the second input terminal. This feature allows the establishment of various signal strength criteria at which the selected combination of the signal seeking and muting operations is enabled.

Figure 1:
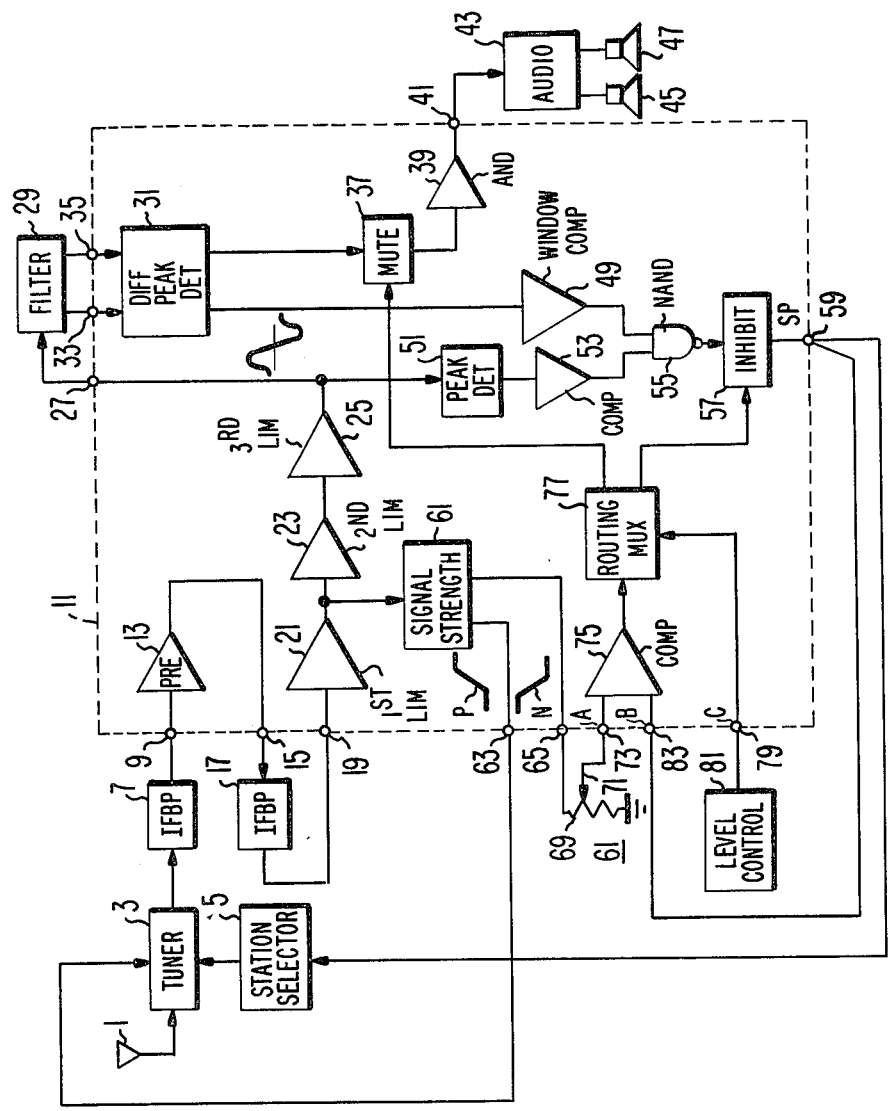
FIG. 1 is a schematic, in block form, of an FM radio receiver employing an arrangement constructed in accordance with the present invention for selecting different combinations of signal seeking and muting operations.

The receiver shown in FIG. 1 includes antenna 1 for receiving RF signals in the FM radio frequency range. A tuner 3 is electronically controlled in response to a tuning voltage generated by a station selector 5 to select one of the received RF signals and to heterodyne it to produce an IF signal.

Station selector 5 comprises an arrangement, such as a phase locked loop, for generating a tuning voltage and controlling its magnitude in response to binary signals corresponding to a selected station. The binary signals representing the selected station are stored in a counter (not specifically shown) which may be caused to count in either increasing order when "up" and "down" station scanning buttons (not specifically shown) are depressed. As the contents of the counter are changed, tuner 3 is caused to sequentially tune respective stations.

The IF signal produced by tuner 3 is filtered by first IF bandpass (BP) filter 7 and applied to IF signal input terminal 9 of an integrated circuit (IC) 11. IC 11 includes limiting amplifiers and an FM discriminator for deriving an audio frequency (AF) signal from the IF signal, signal seeking circuits for generating a pulse for stopping the counter of station selector 5 from counting when the RF input signal exhibits certain predetermined characteristics and muting circuitry for reducing the amplitude of the AF signal when the RF input signal exhibits certain other predetermined characteristics. Further, IC 11 includes signal routing for selectively routing enabling signals, generated by a comparator when the RF signal exhibits the predetermined characteristics, in response to the level of a control signal. The latter, in essence, allows IC 11 to be reconfigured to accommodate the environment in which the receiver is expected to be operated.

Specifically, within IC 11, the IF signal is amplified by a preamplifier 13 and applied through a terminal 15 to a second external IF bandpass filter 17. The output signal of IF bandpass filter 17 is readmitted to IC 11 through a terminal 19 and applied to the first of three cascaded amplifying and limiting stages 21, 23 and 25.

Stages 21, 23 and 25 successively amplify the IF signal applied to terminal 19 to produce a pulse signal at all appreciable RF input signal strengths. The pulse signal is applied through a terminal 27 to a discriminator filter 29. Discriminator filter 29 supplies signals of frequency-dependent phasing to a differential peak detector 31 through two terminals 33 and 35. Discriminator filter 29 and differential peak detector 31 cooperate to form an FM detector. The FM detector produces two AF signals having amplitudes which vary as a function of the frequency difference between the pulse signal and a predetermined IF center frequency, e.g., which is nominally 10.7 MHz. An FM discriminator, comprising a filter and peak detector, suitable for use in the present receiver is described in U.S. patent application Ser. No. 059,469, entitled "Differential FM Detector with Series Tuned Filter" filed on July 20, 1979, in the name of the present inventor, issued on June 9, 1981 as U.S. Pat. No. 4,272,726 and assigned, like the present application, to RCA Corporation, which application is incorporated by reference.

One output signal of detector 31 is applied through a muting circuit 37, when the latter is disabled from muting, to an output amplifier 39. The output signal of amplifier 39 is applied through a terminal 41 to an audio processing unit 43. Audio processing unit 43 decodes the amplified AF signal to produce left and right stereo signals and amplifies these stereo signals before they are applied to left and right speakers 45 and 47.

The other output signal of detector 31 is employed in determining whether or not the receiver is tuned to a station. Specifically, the other output signal of detector 31 is applied to a window comparator 49 which determines when its amplitude is between upper and lower threshold voltages. Under these conditions, the receiver is tuned to the station. To ensure that the tuned station has a predetermined minimum signal strength for producing a minimally acceptable audible response, a peak detector 51 and threshold comparator 53 cooperate to determine when the amplitude of the output signal of the third limiter stage 25 exceeds a predetermined threshold corresponding to the predetermined minimum signal strength. If the receiver is tuned to a station supplying at least the predetermined minimum strength as determined by window comparator 49, peak detector 51 and threshold comparator 53, a NAND circuit 55 generates a negative-going pulse, hereinafter referred to as the "stop pulse" (SP). The stop pulse is applied through an inhibiting circuit 57, when the latter is not in an inhibiting condition, to a terminal 59. Terminal 59 is connected to station selector 5. When the stop pulse is developed at terminal 59, the counter of station selector 5 is stopped from counting at the count corresponding to the tuned station.

Integrated circuit 11 also includes a signal strength detection circuit 61 for detecting the peak amplitude of the output signal from first stage 21 to develop two dc signals, P and N, having magnitudes which are in essence directly and inversely proportional, respectively, to the amplitude of the RF input signal over a predetermined range, e.g., 10 to 500 microvolts. The output signal of first limiter stage 21 is employed for this purpose since the first limiter stage will be the last to reach limiting condition. Signal strength P, directly proportional to the input signal strength, is applied to a terminal 63 and signal strength signal N, inversely proportional to the input signal strength, is applied to a terminal 65. A signal strength detector suitable for use as signal strength detector 61 is described in U.S. patent application Ser. No. RCA 75,075, filed concurrently with the present application in the name of the same inventor and assigned to the same assignee.

One of the signal strength signals, e.g., P, is applied to tuner 3 to reduce its gain as the amplitude of the RF signal increases to prevent signal overloads of tuner 3 and the reception of exceptionally strong off-station RF signals which introduce distortion in the audio signal. The signal strength signals may also be used for other purposes. For example, a signal strength signal may also be applied to the audio processing circuitry 43 to defeat the generation of stereo signals under weak RF signal conditions since noise signals are more perceptible during stereo operation than during monaural operation. For the sake of simplicity of drawing, the connection for the latter function is not shown.

Either of the signal strength signals may also be utilized to enable the operation of the muting unit 37 to reduce the amplitude of the AF signal and/or enable inhibiting unit 57 to inhibit the generation of the stop pulse under a variety of predetermined signal conditions. The existence of various predetermined RF input signal conditions is determined by a comparator 75 in response to signal strength signals P and N and the stop pulse signal SP which are applied to A and B inputs of comparator 75 through terminals 73 and 83 in various input configurations corresponding to respective predetermined signal conditions. A number of input configurations of comparator 75 for determining the existence of respective RF input signal conditions are described below with reference to FIGS. 4-8. In FIG. 1 the input signal configured specifically as discussed with reference to FIG. 5 is shown. For the time being it is sufficient to understand that if the predetermined RF input signal condition exists, comparator 75 will generate an enabling signal.

The enabling signal generated by comparator 75 may be selectively applied to both of, only a first one of, only a second one of, or neither of muting and inhibiting circuits 37 and 57 by controlling the level of a routing control signal applied to a signal routing multiplexer 77 through a terminal 79. This permits the receiver manufacturer utilizing integrated circuit 11 to selectively alter the configuration of the signal seeking and muting circuitry of integrated circuit 11 depending on the environment in which the receiver is to be operated. For this purpose, a level control unit 81 for generating the routing control signal will simply comprise a connection to a fixed voltage provided by the receiver manufacturer in accordance with the intended operating environment of the receiver. Level control unit 81 may also include a switch whereby a user may select the best combination of signal seeking and muting operation.

Figure 2:
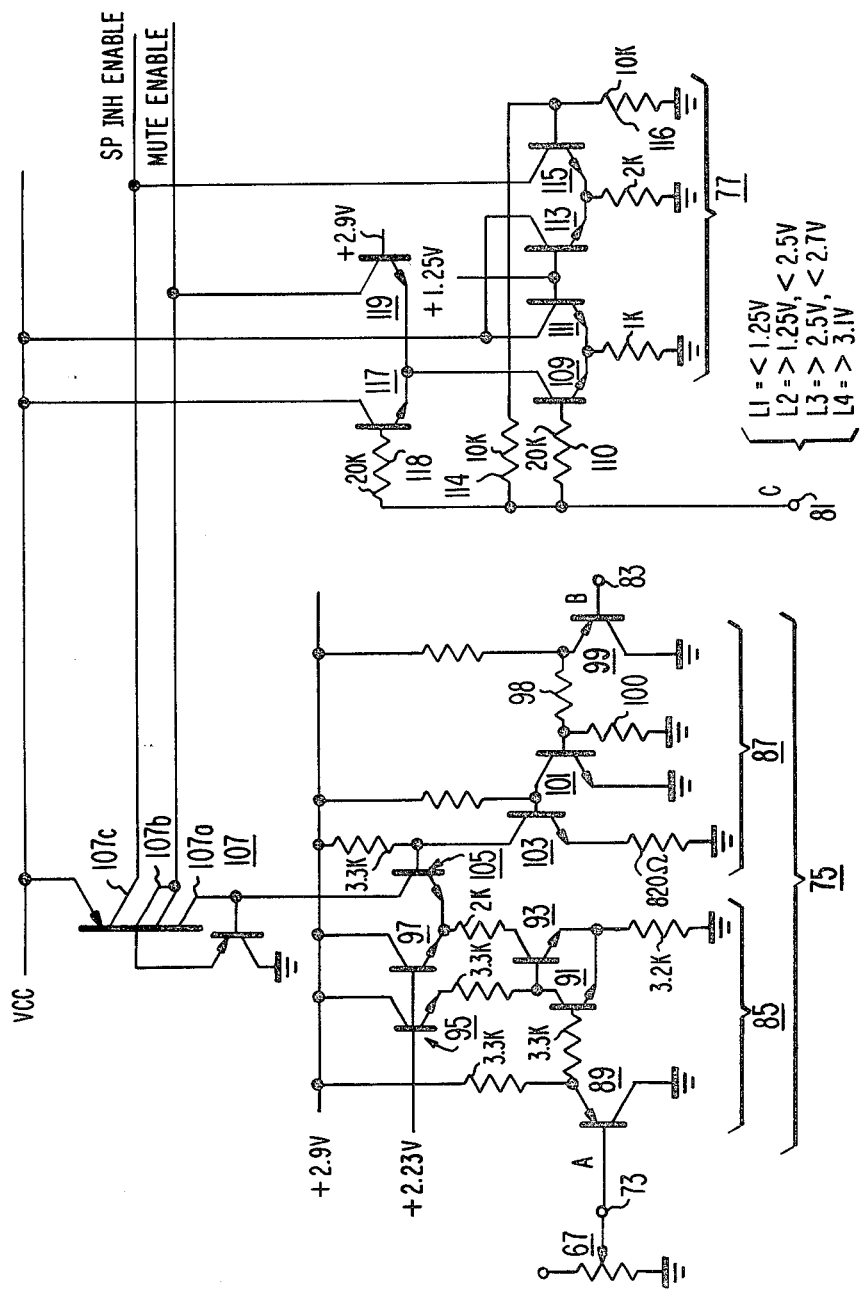
FIGS. 2 and 3 are schematics of circuit implementations of various portions of the receiver shown in FIG. 1.
Figure 3:
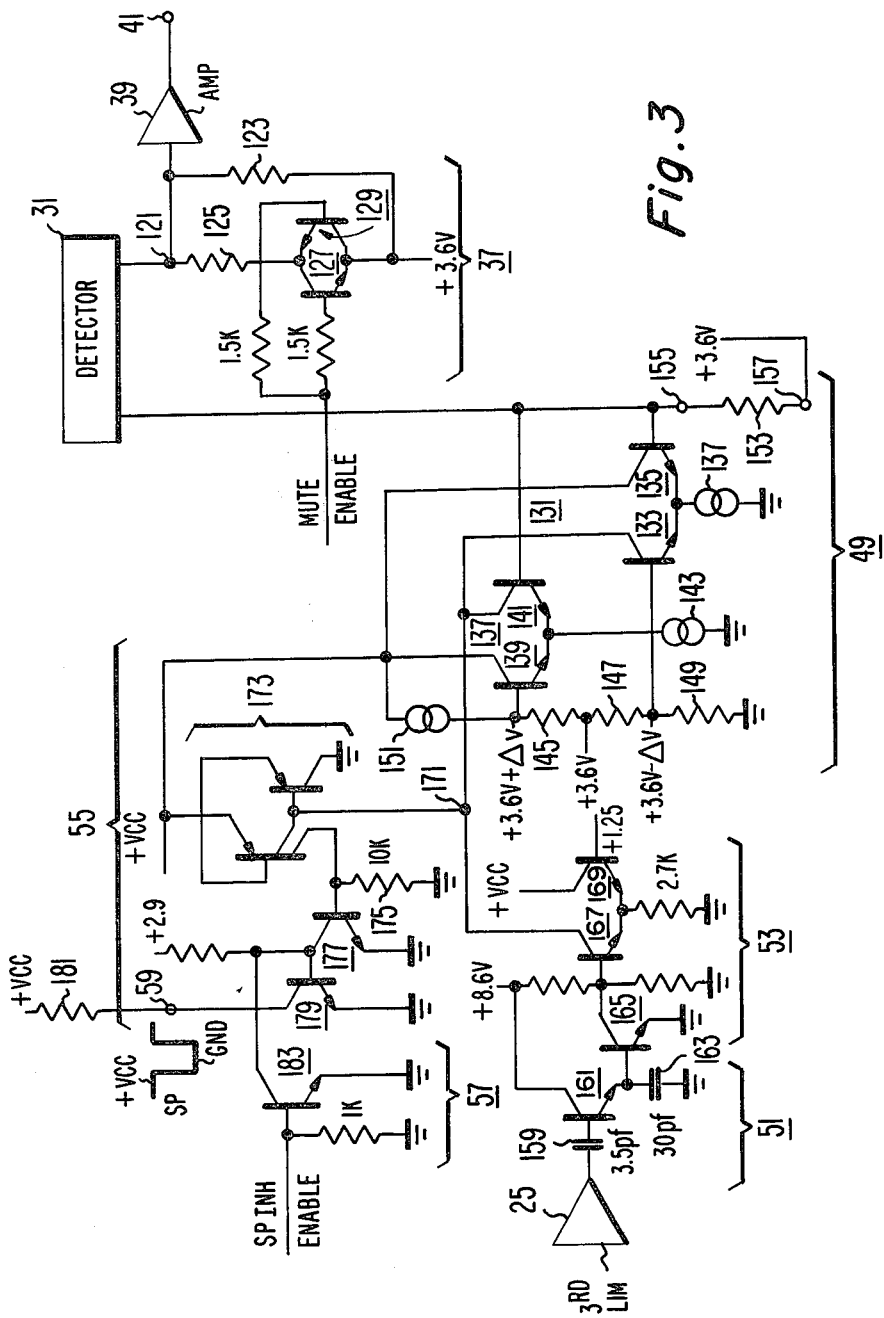

To best understand how signal routing multiplexer 77 may be employed in cooperation with various configurations of comparator 75 to control the signal seeking and muting operations of IC 11 in various operating environments of the receiver, it is first helpful to describe the circuit implementations for comparator 75, routing multiplexer 77, muting unit 37 and stop pulse inhibiting circuit 57 and the circuit implementations of NAND unit 55, threshold comparator 53, peak detector 51 and window comparator 49, which cooperate with stop pulse inhibiting unit 57. FIGS. 2 and 3 are schematics of these circuit implementations. In these schematics, by way of example, typical values of certain supply and reference voltages and certain resistors are indicated. A voltage labelled VCC is the supply voltage, e.g., approximately 15 vdc, applied to integrated circuit 11 from a power supply (not shown). The remaining voltages are derived from supply voltage VCC by a reference voltage supply (not shown) such as a bandgap voltage regulator.

FIG. 2 is a schematic of implementations of comparator 75 and routing multiplexer 77.

Comparator 75 includes a Schmitt trigger 85 and Schmitt trigger enabling circuit 87. Schmitt trigger 85 includes an emitter follower amplifier comprising PNP transistor 89 coupled between A input terminal 73 and the input of an amplifier stage comprising two cascaded common-emitter amplifiers including NPN transistors 91 and 93. The collectors of transistors 91 and 93 are connected by respective resistors to respective emitters of NPN transistors 95 and 97, each of which is configured as an emitter follower transistor. The threshold voltage (VTS) of Schmitt trigger 85 is determined by the voltage applied to the bases of transistors 95 and 97. Although the voltage applied to the bases of transistors 95 and 97 is fixed, the threshold may be effectively adjusted by adjusting the amplitude of the voltage applied to A input terminal 73. This is accomplished by a potentiometer 67 coupled between the source of the voltage to be compared, e.g., signal strength terminals 63 and 65, and A input terminal 73.

When input signal A falls below the threshold voltage, currents will flow through the collector-emitter paths of transistors 93 and 97. If the voltage applied to terminal 73 is above the predetermined threshold, current will now flow through the collector-emitter paths of transistors 93 and 97.

Enabling circuit 87 includes an emitter-follower amplifier comprising a PNP transistor 99 coupled between B input terminal 83 and the input of an amplifier stage comprising three cascaded common-emitter amplifiers including NPN transistors 101, 103 and 105. The collector-emitter path of transistor 105 is connected between the emitter of transistor 97 and the input connection of a current mirror amplifier (CMA) 107. Transistor 105 is conditioned to be conductive when a voltage higher than a threshold voltage (VTE), determined by a voltage divider comprising resistors 98, 100, is applied to B input terminal 83 and is non-conductive when a relatively low voltage below the threshold voltage, e.g., near signal ground potential, is applied to terminal 83. When transistor 105 is conditioned to be conductive and transistor 93 is conductive, a portion of the current flowing through transistor 93 is diverted through the collector-emitter path of transistor 105 to CMA 107. Thus, comparator 75 will apply an input current to CMA 107 only when the voltage A at terminal 73 falls below its respective threshold value (VTS) and the voltage at terminal B is greater than its respective threshold value (VTE). The following table summarizes the operation of comparator 75.

TABLE 1

| INPUT A | INPUT B | CURRENT TO CMA 107 |
|---|---|---|
| >VTS | >VTE | No |
| <VTS | >VTE | Yes |
| >VTS | <VTE | No |
| <VTS | <VTE | No |

Current mirror amplifier 107 includes a multiple collector PNP transistor having a first collector 107a and a base coupled through another PNP transistor to condition first collector 107a to supply current to comparator 75 when transistors 105 and 93 are conductive. Under these conditions, second and third collectors 107b and 107c supply proportionally related enabling currents to muting unit 37 and stop pulse inhibiting unit 57. The area of collector 107b is made larger, e.g., by a factor of 2, than the areas of collectors 107a and 107c so that a larger enabling current is provided to muting unit 37.

Routing multiplexer 77 comprises a current steering network for selectively diverting currents provided by current mirror amplifier 107 from muting circuit 37 and stop pulse inhibiting circuit 57. The current steering network of routing multiplexer 77 includes three pairs of transistors, 109 and 111, 113 and 115, and 117 and 119 arranged in respective differential configurations. Control voltage C is applied to the bases of transistors 109 and 117 substantially unattenuated through respective resistors 110 and 118. Control voltage C is applied to the base of transistor 115 after attenuation by a voltage divider including resistors 114 and 116. When control voltage C applied to terminal 81 is at a first level L1, e.g., less than +1.25 volts, transistors 109, 115, 117 and 119 are non-conductive and transistors 111 and 113 are conductive. As a result, the enabling currents will not be diverted from muting unit 37 or from stop pulse inhibiting unit 57. When control voltage C is at a second level L2, e.g., between +1.25 and +2.5 volts, transistors 109, 113 and 119 are conductive and transistors 111, 115 and 117 are non-conductive. Transistor 109 is conductive while transistor 115 is non-conductive in response to the second level L2 due to the attenuation of the voltage divider including resistors 114 and 116 coupled to the base of transistor 115. As a result, the enabling current will be diverted from muting unit 37 but will now be diverted from stop pulse inhibiting unit 57. When control voltage C at terminal 81 is at a third level L3, e.g., between +2.5 and +2.7 volts, transistors 109, 115 and 119 will be conductive and transistors 111, 113 and 117 will be non-conductive. As a result, current will be diverted from both muting unit 37 and stop pulse inhibiting unit 57. Finally, when control voltage C is at a fourth level L4, e.g., greater than +3.1 volts, transistors 117, 109 and 115 will be conductive and transistors 119, 111 and 113 will be non-conductive. As a result, current will be diverted from stop pulse inhibiting unit 57 but will not be diverted from the muting unit 37. The following table summarizes the operation of routing multiplexer 77 for selectively enabling the operation of muting unit 37 and stop pulse inhibiting unit 57.

TABLE 2

| CONTROL LEVEL | MUTING ENABLED | STOP PULSE INHIBITED |
|---|---|---|
| L1 | Yes | Yes |
| L2 | No | Yes |
| L3 | No | No |
| L4 | Yes | No |

FIG. 3 is a schematic of circuit implementations for muting circuit 37, window comparator 49, peak detector 51, threshold comparator 53, NAND unit 55 and inhibiting unit 57.

Muting circuit 37 includes an arrangement for shunting a point 121 between one output of detector 31 and amplifier 39 to a point of fixed voltage, which is at signal ground potential, in response to the application of the muting enable current. A resistor 123 is connected between point 121 and the point at which the fixed voltage is applied. A series path comprising a resistor 125 and the parallel combination of the collector-emitter paths of two NPN transistors 127 and 129 is connected in parallel combination with resistor 123. Transistors 127 and 129 are rendered conductive in response to the application of the muting enable current. As a result, the parallel combination of resistors 123 and 125 shunts point 121 to signal ground. The degree of muting is determined by the relationship of resistor 123 to the value of the parallel combination of resistors 123 and 125. In terms of decibel (dB), the amount of muting is expressed by the equation $$20 \log R123/R125 \| R123 \qquad (1)$$

where R123 and R125 are the resistance value of resistors 123 and 125. While muting unit 37 is arranged to provide partial muting so as to reduce the audible "click" which occurs when muting is initiated, complete muting may be provided by replacing resistor 125 with a direct connection without substantial resistance.

Window comparator 49 includes a first comparator 131 comprising NPN transistors 133 and 135 and a current source 137 arranged in a first differential configuration and a second comparator 137 comprising NPN transistors 139 and 141 and a current source 143 arranged in a second differential configuration. The collectors of transistors 133 and 141 are connected together to form an output of window comparator 49 at a point 171, discussed below with reference to NAND unit 55. Reference voltages for comparators 131 and 137 are developed by a voltage divider including resistors 145, 147 and 149. A current source 151 supplies current for the voltage divider. A regulated voltage, e.g., +3.6 volts, is applied to the junction of resistors 145 and 147. The voltage developed at the top of the voltage divider is equal to the regulated voltage plus the voltage developed across resistor 145 and is applied to the base of transistor 139. The voltage developed at the junction of resistors 147 and 149 is equal to the regulated voltage minus the voltage developed across resistor 147 and is applied to the base of transistor 133.

The signal supplied by detector 31 is a current. This current is converted to a corresponding voltage by an external resistor 133 connected between a terminal 155 connected to the output of detector 31 and another terminal 157 connected to a regulated voltage. The voltage developed across resistor 153 is applied to the bases of transistors 135 and 141. The use of external resistor 153 for developing the voltage to be evaluated by window comparator 49 allows the width of the "comparison window" to be adjusted as desired by the receiver manufacturer.

When the voltage developed across resistor 153 is below the reference voltage applied to the base of transistor 133, transistor 133 is conductive. When the voltage developed across transistor 153 is greater than the reference voltage applied to the base of transistor 139, transistor 141 is conductive. When the voltage developed across resistor 153 is between the reference voltages applied to the bases of transistors 133 and 139, neither one of transistors 131 and 133 is conductive. Thus, as long as a station has not been tuned, one of transistors 133 and 141 is conductive and when a station has been tuned neither of transistors 133 and 141 is conductive.

Peak detector 51 comprises an NPN transistor 161 configured as an emitter follower amplifier. The output of third limiter stage 25 is applied through a dc blocking capacitor 159 to the base of transistor 161. A capacitor 163 connected between the emitter of transistor 161 and signal ground is charged in response to the peak positive amplitude of the output signal of third limiter stage 25.

Threshold comparator 53 comprises a common emitter amplifier including an NPN transistor 165 followed in cascade by a differential configuration including NPN transistors 167 and 169. The collector of transistor 167 is the output of comparator 53 and is connected to the collectors of transistors 133 and 141 of window comparator 49 at point 171. A regulated voltage applied to the base of transistor 169 determines the threshold of comparator 53. As long as the voltage at the collector of transistor 165 is above the threshold, indicating that the RF input is below a corresponding predetermined minimum value for an acceptable audio response, transistor 167 is conductive.

NAND unit 55 includes a CMA 173 having an input at point 171. The output of CMA 173 is connected to a resistor 175 at the input of an amplifier stage. The amplifier stage comprises two cascaded common emitter amplifiers including NPN transistors 177 and 179. The collector of transistor 179 is connected to terminal 59. A load resistor 181 is connected between an external point at which +VCC is present and terminal 59.

When any one of transistors 133 and 141 of window comparator 49 or transistor 167 of threshold comparator 53 is conductive, indicating the absence of a station with at least the minimum acceptable signal strength, a current path is provided at the input to CMA 173 at point 171 and, as a result, current is applied to resistor 175. This causes transistor 177 to be conductive and transistor 179 to be non-conductive, thereby developing a voltage substantially equal to +VCC at terminal 59. When all of transistors 133 and 141 of window comparator 49 and transistor 167 of threshold comparator 53 are non-conductive, indicating the presence of a station with at least the minimum acceptable signal strength, no current path is at the input to CMA 173 at point 171 and, as a result, current is not applied to resistor 175. This causes transistor 177 to be non-conductive and, so long as a transistor 183 in stop pulse inhibiting unit 57 is non-conductive, also causes transistor 179 to be conductive, thereby developing a voltage substantially equal to ground potential at terminal 59.

Stop pulse inhibiting unit 57 comprises a common emitter amplifier including an NPN transistor 183 having its collector connected to the base of transistor 179 and its base connected to collector 107c of CMA 107. When the stop pulse inhibit enabling current is applied to the base of transistor 183, it is rendered conductive. As a result, transistor 179 is inhibited from being rendered conductive. As long as this condition remains, the voltage at terminal 59 remains at +VCC and no stop pulse can be generated.

As earlier indicated, there is a variety of different combinations of signal seeking and muting operations and signal strength criteria at which these operations are enabled, afforded by comparator 75 and signal routing multiplexer 77 of integrated circuit 11, depending on the level of routing control voltage C for signal routing multiplexer 77 voltages applied to A and B inputs of comparator 75. FIGS. 4–8 illustrate some of these. In these FIGURES, signal routing multiplexer 77 has been illustrated as simply comprising two single pole single threshold switches 77a and 77b connected at respective first ends to the output of comparator 75 and at respective second ends of muting circuit 37 and stop pulse inhibiting circuit 57. Reference to Tables 1 and 2 will be helpful during the descriptions of FIGS. 4-8.

Figure 4:
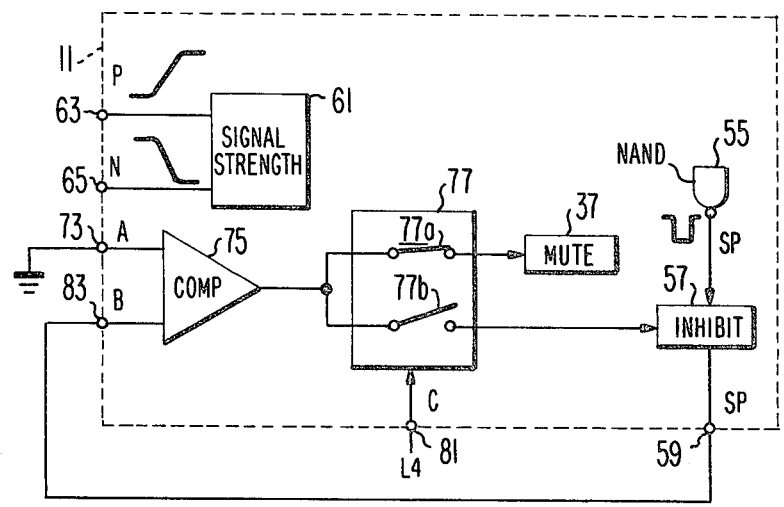
FIGS. 4-8 are schematics, in block form, indicating how the arrangement for selecting different combinations of signal seeking and muting operations shown in FIG. 1 may be employed in different operating environments of the radio receiver.
Figure 5:
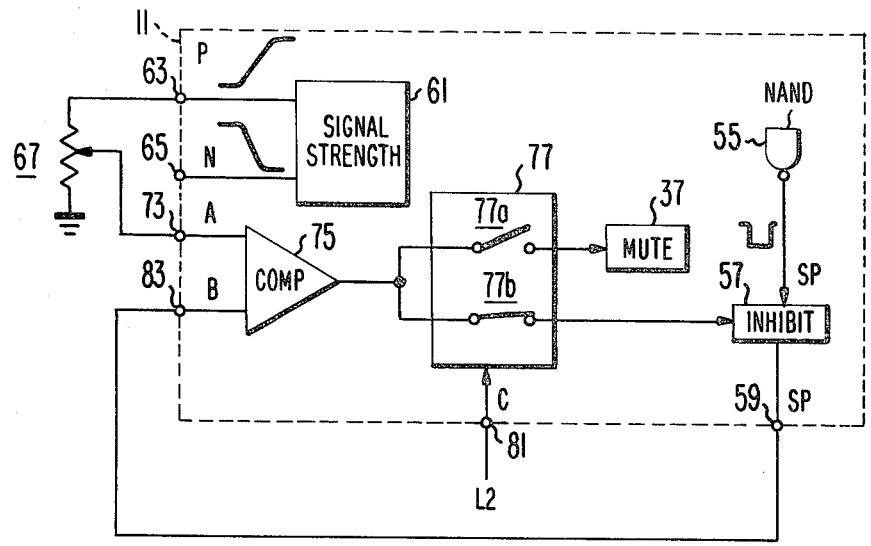

In FIG. 4, A input terminal 73 is connected to signal ground and B input terminal 82 is connected to SP terminal 59. In addition, control level C, applied to terminal 81, is set at level L4 so that multiplexer 77 behaves in effect as if switch 77a were closed and switch 77b were opened. A stop pulse is generated whenever a station is tuned that has the predetermined minimum signal strength for acceptable reception, as determined by window comparator 49, peak detector 51 and threshold comparator 53, and the audio signal is muted between stations. This configuration is useful in environments, such as rural areas, where there are only a few stations having only moderate signal strength.

In FIG. 5, positive-going signal strength signal (P) terminal 63 is coupled to A input terminal 73 through a potentiometer 69 and stop pulse (SP) terminal 59 is connected to B input terminal 83. In addition, control signal C, applied to terminal 81, is set to level L2 so that switch 77a is opened and switch 77b is closed. A stop pulse is generated only when the RF input signal exceeds a predetermined level above the minimum level. Thus tuning is stopped only at relatively strong stations and relatively weak stations are passed over. Muting is not provided. Muting is disabled to avoid a disconcerting muting "click" that would otherwise occur quite frequently (even though partial muting is employed) as weak stations are passed over. This configuration is useful in environments, such as urban areas, where there are a large number of strong stations.

Figure 6:
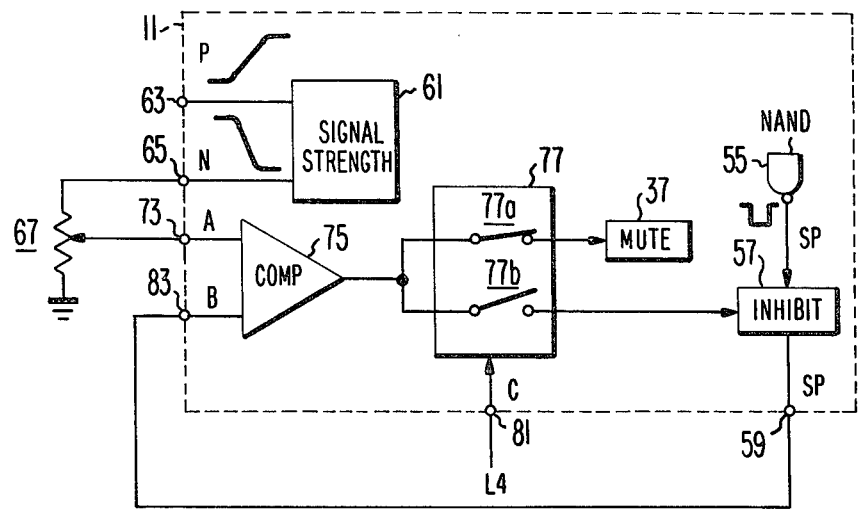

In FIG. 6, the negative-going signal strength (N) terminal 65 is coupled to A input terminal 73 through a potentiometer 67 and stop pulse (SP) terminal 59 is connected to B input terminal 83. In addition, control voltage C is set to level L4 so that switch 77a is closed and switch 77b is opened. A stop pulse is generated when a station is tuned having the minimum signal strength for acceptable reception, as determined by window comparator 49, peak detector 51 and threshold comparator 53, and audio muting occurs between stations only when the amplitude of the RF input signal is greater than a predetermined value. This configuration is useful in environments, such as in cities, where there are many exceptionally strong stations. Under these circumstances, off-station RF input signals may be so strong that they cannot be adequately removed by the RF and IF filters and, as a result, produce audio response even when the corresponding stations are not tuned. Since muting only occurs when the RF input level exceeds the predetermined value, the occurrences of muting "clicks" will be minimized.

Figure 7:
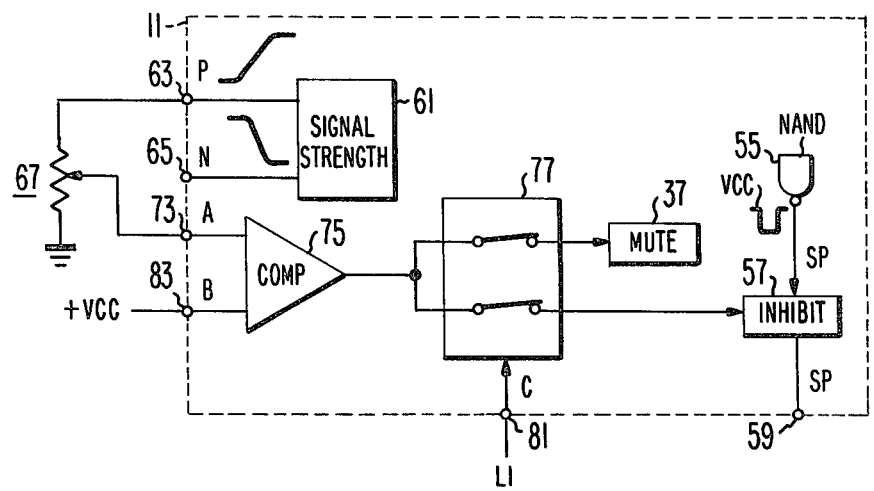

In FIG. 7, a positive voltage near +VCC, corresponding to the upper level of the stop pulse signal, is applied to B input terminal 83 and positive signal strength (P) terminal 63 is connected through a potentiometer 67 to the A input 73. In addition, control signal C is set at level L1 so that both of switches 77a and 77b are closed. A stop pulse is not generated and the audio is muted when the RF signal strength for any station is below a predetermined level. This configuration is useful in environments in which there are a large number of stations, many of which have signal strengths low enough to be in the noise region.

Figure 8:
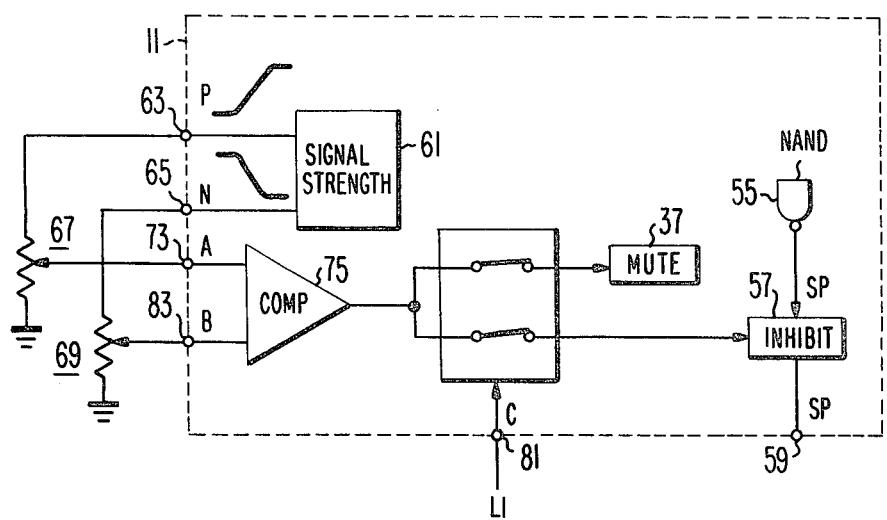

In FIG. 8, first positive-going signal strength (P) terminal 63 is connected through a first potentiometer 67 to A input terminal 73 and negative-going signal strength (N) terminal 65 is connected to input B terminal 83 through a second potentiometer 69. In addition, control voltage C is set at level L1 so that both of switches 77a and 77b are closed. The settings of potentiometers 67 and 69 determine a predetermined amplitude window. The lower boundary of the amplitude window is determined by the setting of potentiometer 67. The upper boundary of the amplitude window is determined by the setting of potentiometer 69. If the amplitude of the RF input signal is outside the amplitude window, comparator 75 will generate an enabling signal for muting unit 37 and stop pulse inhibit unit 57. Thus, a stop pulse is not generated and the audio is muted when the RF input signal has an amplitude outside the amplitude window. This configuration is useful in environment having a large number of stations where it is desired to skip and mute both those stations which have low signal strengths likely to produce noisy responses and those stations which have high signal strengths likely to produce distortion.

No configuration is illustrated in which the routing control signal is set at level L3 so that both the muting and stop pulse inhibiting operations will be disabled since this condition can also be accomplished by merely leaving input terminals 73 and 83 for comparator 75 disconnected. However, the value of being able to set the routing control signal at level L3 to disable the muting and stop pulse inhibiting operations when input terminals 73 and 83 are connected in a configuration for a certain operating environment when the operating environment is changed should not be overlooked. For example, assume that the terminals 73 and 83 have been connected in the configuration illustrated in FIG. 7 and the routing control signal set at level L1, so that stations with relatively low signal strengths will be skipped and muted. Now, the operating environment of the receiver is changed to an area having only stations with relatively low signal strengths, the tuning of such stations can readily be permitted by changing the routing control signal to level L3. This may be accomplished by a user-operated selector switch. It is also contemplated that this may be accomplished automatically by a microprocessor for setting the level of the routing control level in response to signal strength conditions.

While the present invention has been described in terms of an FM radio receiver, it is contemplated that it may also be used in other radio receivers and in television receivers. These and other modifications are intended to be within the scope of the present invention as defined by the following claims.

What is claimed is:

1. In a receiver receiving RF signals corresponding to respective stations, apparatus comprising:

tuning means for tuning said receiver to selected ones of said RF signals to generate an IF signal;

processing means for processing said IF signal to produce an information bearing output signal;

mute means for inhibiting the generation of said information bearing output signal, when enabled by a mute enabling signal;

a signal strength means for generating at least a first signal strength signal having a magnitude representing the RF input signal strength;

station detector means for generating a stop signal when IF signal has a pedetermined condition indicating the tuning of one of said RF signals;

stop signal inhibit means for inhibiting the generation of said stop signal when enabled by a stop signal inhibit enabling signal;

comparator means having at least a first input for receiving a first input signal and an output for generating at said output an enabling signal when said first input signal has a first predetermined amplitude condition;

first connection means for applying one of said first signal strength signal and said stop signal to said first input of said comparator means as said first signal;

a source of a DC control signal which is independent of said RF signals; and signal routing means for selectively routing said enabling signal to said mute means and stop signal inhibit means as the respective one of said mute enabling signal and said stop signal inhibit enabling signal in accordance with different levels of said control signal, said signal routing means at least routes said enabling signal to said stop signal inhibit means but does not route said enabling signal to said mute means in response to one level of said control signal and routes said enabling signal to said mute means but does not route said enabling signal to said inhibit means in response to a different level of said control signal.

2. The apparatus recited in claim 1 wherein:

said comparator means includes a second input for receiving a second input signal and comparator enabling means for enabling the generation of said mute enabling signal and said stop inhibit enabling signal in response to said first input signal when said second input signal has a second predetermined amplitude condition.

3. The apparatus recited in claim 2 wherein:

said signal routing means routes said enabling signal to said mute means and also routes said enabling signal to said stop signal inhibit means in response to a first level of said control signal;

said signal routing means routes said enabling signal to said stop signal inhibit means but does not route said enabling signal to said mute means in response to a second level of said control signal;

said signal routing means does not route said enabling signal to said mute means and does not route said enabling signal to said inhibit means in response to a third level of said control signal; and said signal routing means routes said enabling signal to said mute means but does not route said enabling signal to said stop signal inhibit means in response to a fourth level of said control signal.

4. The apparatus recited in claim 3 wherein:

said comparator enabling means enables the generation of said enabling signal when said second input signal has an amplitude with a second amplitude range; and said comparator means generates said enabling signal, when enabled, when said first input signal has an amplitude with a first amplitude range.

5. The apparatus recited with claim 4 further including:

reference signal means for developing a first reference signal having an amplitude within said first amplitude range and a second reference signal having an amplitude within said second amplitude range;

said stop signal has an amplitude within said second amplitude range;

said first connection means applies one of said first reference signal, said first signal strength signal and said stop signal to said first input of said comparator means; and second connection means for applying one of the said second reference signal and the remaining one of said first signal strength signal and said stop signal not applied to said first input of said comparator to said second input of said comparator means.

6. The apparatus recited in claim 5 wherein:

said first reference signal is applied to said first input of said comparator means and said stop signal is applied to said second input of said comparator means; and said control signal is set to said fourth level.

7. The apparatus recited in claim 5 wherein:

said first signal strength signal is applied to said first input of said comparator and said stop signal is applied to said second input of said comparator; and said control signal is set to said second level.

8. The apparatus recited in claim 5 wherein:

said first signal strength signal is applied to said first input of said comparator and said stop signal is applied to said second input of said comparator; and said control signal is set to said fourth level.

9. The apparatus recited in claim 5 wherein:

said first signal strength signal is applied to said first input of said comparator and said second reference signal is applied to said second input of said comparator; and said control signal is set to said first level.

10. The apparatus recited in claim 5 wherein:

said signal strength means generates a second signal strength signal having a magnitude representing the RF input signal strength in inverse relationship to said first signal strength signal;

said first connection means applies one of said first and second signal strength signals to said first input of said comparator means; and said second connection means applies the other one of said first and second signal strength signals to said second input of said comparator means.

11. The apparatus recited in claim 10 wherein:

said control signal is set to said first level.

12. The apparatus recited in claim 5 wherein:

said processing means, said mute means, said station detector means, said stop signal inhibit means, said comparator means and said signal strength means are incorporated in a single integrated circuit having respective terminals connected to said station detector means for receiving said stop signal, to said first and second inputs of said comparator means for receiving said first and second input signals and to said signal strength means for receiving said first signal strength signal.

13. The apparatus recited in claim 2 wherein:

said comparator means includes current generating means for generating a first current which is coupled to said mute means as said mute enabling signal and a second current which is coupled to said stop signal inhibiting means as said stop signal inhibit signal, when enabled, when said first input signal has said first predetermined condition; and said signal routing means includes current steering means for selectively diverting said first and second currents from said mute enabling means and said stop signal inhibit means, respectively, in response to said control signal.

14. The apparatus recited in claim 13 wherein:

said comparator means includes a current source having first and second outputs for providing said first and second currents, respectively; and said current steering means includes first and second transistors arranged in a first differential configuration, third and fourth transistors arranged in a second differential configuration, and fifth and sixth transistors arranged in a third differential configuration, in each one of said differential configurations said control signal being applied to the base of one of said transistors and a reference voltage being applied to the base of the other one of said transistors, in each one of said differential configurations the emitters of both of said transistors being connected at a common point, the collector of one of said first and second transistors in said first differential configuration being connected to said first output, said common point of said first differential configuration being connected to the collector of one of said third and fourth transistors of the said second differential configuration, the common point of said second differential configuration being connected to a circuit point, the collector of one of said fifth and sixth transistors of said third differential configuration being connected to the other one of said second output, said common point of said third differential configuration being connected to said reference point.

15. The apparatus recited in claim 14 wherein:

said current source includes a current mirror amplifer.

* * * * *